US012675433B2

(12) United States Patent
Mahurin et al.

(10) Patent No.: US 12,675,433 B2
(45) Date of Patent: Jul. 7, 2026

(54) CLOCKING A SYSTOLIC ARRAY ON BOTH EDGES OF A CLOCK SIGNAL

(71) Applicant: QUALCOMM Incorporated, San Diego, CA (US)

(72) Inventors: Eric Wayne Mahurin, Austin, TX (US); Jinxia Bai, San Diego, CA (US); Tejaswi Talluru, Roundrock, TX (US); Hidayatullah Chowdary, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 101 days.

(21) Appl. No.: 18/786,038

(22) Filed: Jul. 26, 2024

(65) Prior Publication Data

US 2026/0030199 A1 Jan. 29, 2026

(51) Int. Cl.
*G06F 15/80* (2006.01)
*G06F 7/544* (2006.01)
*H03L 7/081* (2006.01)

(52) U.S. Cl.
CPC ........ *G06F 15/8046* (2013.01); *G06F 7/5443* (2013.01); *H03L 7/0818* (2013.01)

(58) Field of Classification Search
CPC ....................................................... G06F 1/32
See application file for complete search history.

(56) References Cited

U.S. PATENT DOCUMENTS

2005/0281331 A1* 12/2005 Hahm ................... H04N 19/159
                                                          375/240.03
2012/0236945 A1    9/2012 Mazumdar et al.
2023/0126683 A1*   4/2023 Ning ...................... G11C 7/222
                                                          713/500

OTHER PUBLICATIONS

Choi J., et al., "A New Linear Systolic Array for FFT Computation", IEEE Transactions on Circuits and Systems Ii: Analog and Digital Signal Processing, Institute of Electrical and Electronics Engineers Inc, 345 East 47 Street, New York N Y 10017, USA, vol. 39, No. 4, Apr. 1, 1992, pp. 236-239, XP000305836, abstract; figure 7 p. 3, left-hand column.
International Search Report and Written Opinion—PCT/US2025/ 032707—ISA/EPO—Oct. 17, 2025.

* cited by examiner

*Primary Examiner* — Keshab R Pandey
(74) *Attorney, Agent, or Firm* — Patterson + Sheridan LLP

(57) ABSTRACT

The present disclosure is directed to an apparatus that includes a systolic array having an initial systolic stage that is clocked at a first edge of a clock signal. The apparatus further includes control logic configured to clock a first subset of a plurality of additional systolic stages of the systolic array at the first edge of the clock signal. The control logic is further configured to clock a second subset of the plurality of systolic stages at a second edge of the clock signal.

17 Claims, 6 Drawing Sheets

500

502

CLOCKING A FIRST SYSTOLIC STAGE OF THE SYSTOLIC ARRAY AT A FIRST EDGE OF A FIRST CYCLE OF A CLOCK SIGNAL

504

CLOCKING A SECOND SYSTOLIC STAGE OF THE SYSTOLIC ARRAY AT A SECOND EDGE OF A SECOND CYCLE OF THE CLOCK SIGNAL THAT FOLLOWS THE FIRST CYCLE OF THE CLOCK SIGNAL

CLOCKING A SYSTOLIC ARRAY ON BOTH EDGES OF A CLOCK SIGNAL

Aspects of the present disclosure generally relate to hardware accelerators having a systolic array including a plurality of systolic stages and, more particularly, to clocking the systolic stages on both edges (e.g., rising edge, falling edge) of an input clock signal.

BACKGROUND

A hardware accelerator may be used to support a main processor (e.g., central processing unit) of a processing system. For example, the main processor may offload computationally intensive tasks (e.g., matrix multiplication) or applications to the hardware accelerator. Matrix multiplication, which is commonly associated with machine learning and digital signal processing applications, is an example of a computationally intensive task that may be offloaded to the hardware accelerator. To perform such a task, the hardware accelerator may have a parallel processing architecture, such as a systolic array include a plurality of processing elements. Each of the processing elements may be considered a systolic stage and may include one or more hardware components (e.g., a multiplier and an accumulator) configured to perform matrix multiplication. The systolic array allows the hardware accelerator to perform matrix multiplication faster and more efficiently than the main processor.

BRIEF SUMMARY

Certain aspects provide an apparatus comprising: a systolic array comprising an initial systolic stage clocked at a first edge of a clock signal, the systolic array further comprising a plurality of additional systolic stages; and control logic configured to clock a first subset of the plurality of additional systolic stages at the first edge of the clock signal and a second subset of the plurality of additional systolic stages at a second edge of the clock signal.

Certain aspects of the present disclosure provide a method of operating a systolic array, comprising: clocking a first systolic stage of the systolic array at a first edge of a first cycle of a clock signal; and clocking a second systolic stage of the systolic array at a second edge of a second cycle of the clock signal that follows the first cycle of the clock signal.

Certain aspects of the present disclosure provide an apparatus, comprising: means for clocking a first systolic stage of a systolic array at a first edge of a first cycle of a clock signal; and means for clocking a second systolic stage of the systolic array at a second edge of a second cycle of the clock signal.

The following description and the related drawings set forth in detail certain illustrative features of one or more aspects.

BRIEF DESCRIPTION OF THE DRAWINGS

The appended figures depict certain features of one or more aspects of the present disclosure and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Aspects of the present disclosure provide apparatuses including a systolic array having systolic stages clocked on both edges of an input clock signal and a related method for operating the systolic array.

As discussed above, hardware accelerators configured to perform computationally intensive tasks (e.g., matrix multiplication) may have a parallel processing architecture, such as a systolic array. Also, as discussed below in more detail with reference to FIG. 2, the systolic array includes a plurality of systolic stages, with each of the plurality of systolic stages including a plurality of processing elements. Furthermore, in operation, each of the systolic stages of the systolic array are typically clocked on the same edge (e.g., positive edge) of an input clock signal. However, as will be discussed in more detail with reference to FIG. 3, clocking the systolic stages on the same edge of the input clock signal leads to inefficiencies (e.g., increased power consumption) associated with operation of the systolic array.

Example aspects of the present disclosure are generally directed to clocking a first group of systolic stages of the systolic array on a first edge (e.g., rising edge) of the input clock signal and clocking a second group of systolic stages of the systolic array on a second edge (e.g., falling edge) of the input clock signal. For example, as described in more detail below with reference to FIG. 4, the systolic stages of the systolic array may be clocked on alternating edges of the input clock signal to lower peak power demands of the systolic array compared to when all of the systolic stages of the systolic array are clocked on the same edge (e.g., rising) of the input clock signal.

Example Heterogeneous Computing System

Figure 1:
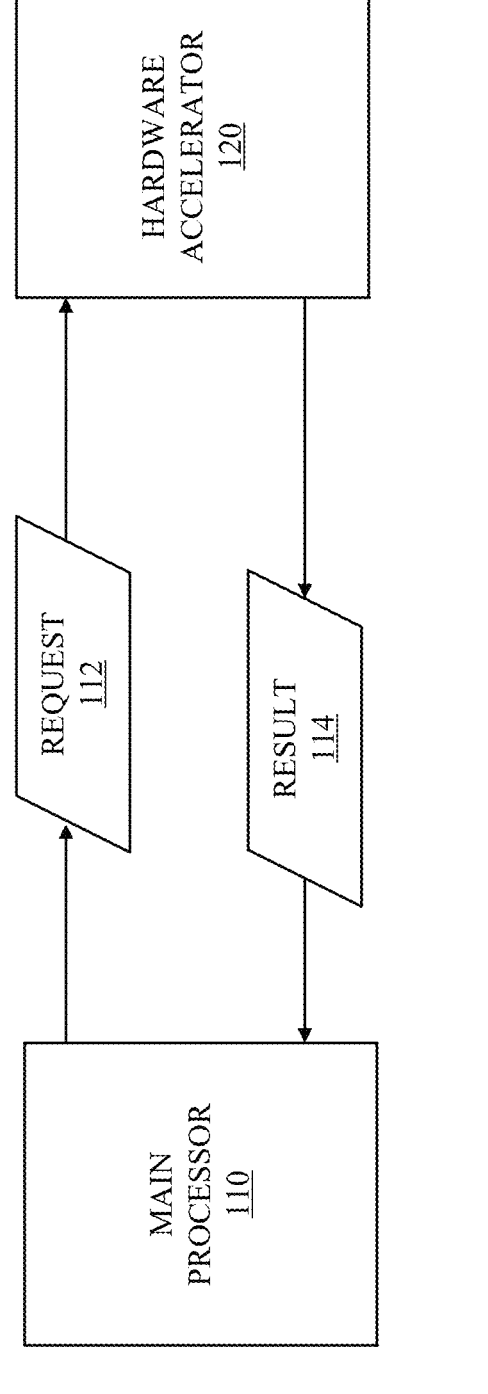
FIG. 1 depicts a heterogeneous computing system according to various aspects of the present disclosure.

FIG. 1 depicts a heterogeneous computing system 100 according to aspects of the present disclosure. The heterogeneous computing system 100 may be used in a variety of different apparatuses (e.g., smartphones, tablets) and may be used for a variety of different applications (e.g., machine learning, digital signal processing, graphics processing). The heterogeneous computing system 100 includes a main processor 110 and a hardware accelerator 120. The main processor 110, which in some aspects may be a central processing unit (CPU), handles general-purpose computing tasks. The main processor 110 delegates computationally-intensive tasks, such as matrix multiplication, to the hardware accelerator 120. Examples of the hardware accelerator 120 may include, without limitation, a graphics processing unit (GPU), a neural processing unit (NPU), and a tensor processing unit (TPU).

As illustrated, the main processor 110 may send a request 112 to the hardware accelerator 120. The request 112 may, for example, be for the hardware accelerator 120 to perform a computationally intensive task (e.g., matrix multiplication) on data associated with a particular application (e.g., machine learning, digital signal processing) being executed by the heterogeneous computing system 100. The hardware accelerator 120 may communicate a result 114 of the computationally intensive task to the main processor 110. For example, in the case of matrix multiplication, the request 112 may be for the hardware accelerator 120 to multiply a first matrix (e.g., Matrix A) with a second matrix (e.g., Matrix B). In such a case, the result 114 the hardware accelerator 120 provides to the main processor 110 may include data associated with a third matrix (e.g., Matrix C) that is the result of multiplying the first matrix with the second matrix. For instance, in some aspects, the data associated with the third matrix may include numerical values for each of the different matrix elements of the third matrix.

To perform the computationally intensive task, the hardware accelerator 120 may implement a parallel processing architecture. As will be discussed in more detail with reference to FIG. 2, the parallel processing architecture may include a systolic array. As used herein, a "systolic array" may refer to a grid (e.g., including rows and columns) of interconnected processing elements that operate in a pipelined fashion such that data flows through the grid in a synchronized, rhythmic manner like the beating of a heart (hence the "systolic" name)." Furthermore, as used herein, a "systolic stage" refers to interconnected processing elements that make up a portion (e.g., particular row or particular column) of the grid.

The systolic array may be used to perform matrix multiplication. However, the systolic array may be used to perform other computationally intensive tasks besides matrix multiplication. Examples of other types of computationally intensive tasks that the systolic array 200 may be configured to perform may include, without limitation, video processing tasks (e.g., filtering, edge detection, compression/decompression), digital signal processing tasks (e.g., discrete Fourier transform (DFT), convolution), cryptography tasks (e.g., modular arithmetic computations, elliptical curve computations).

Example Systolic Array

Figure 2:
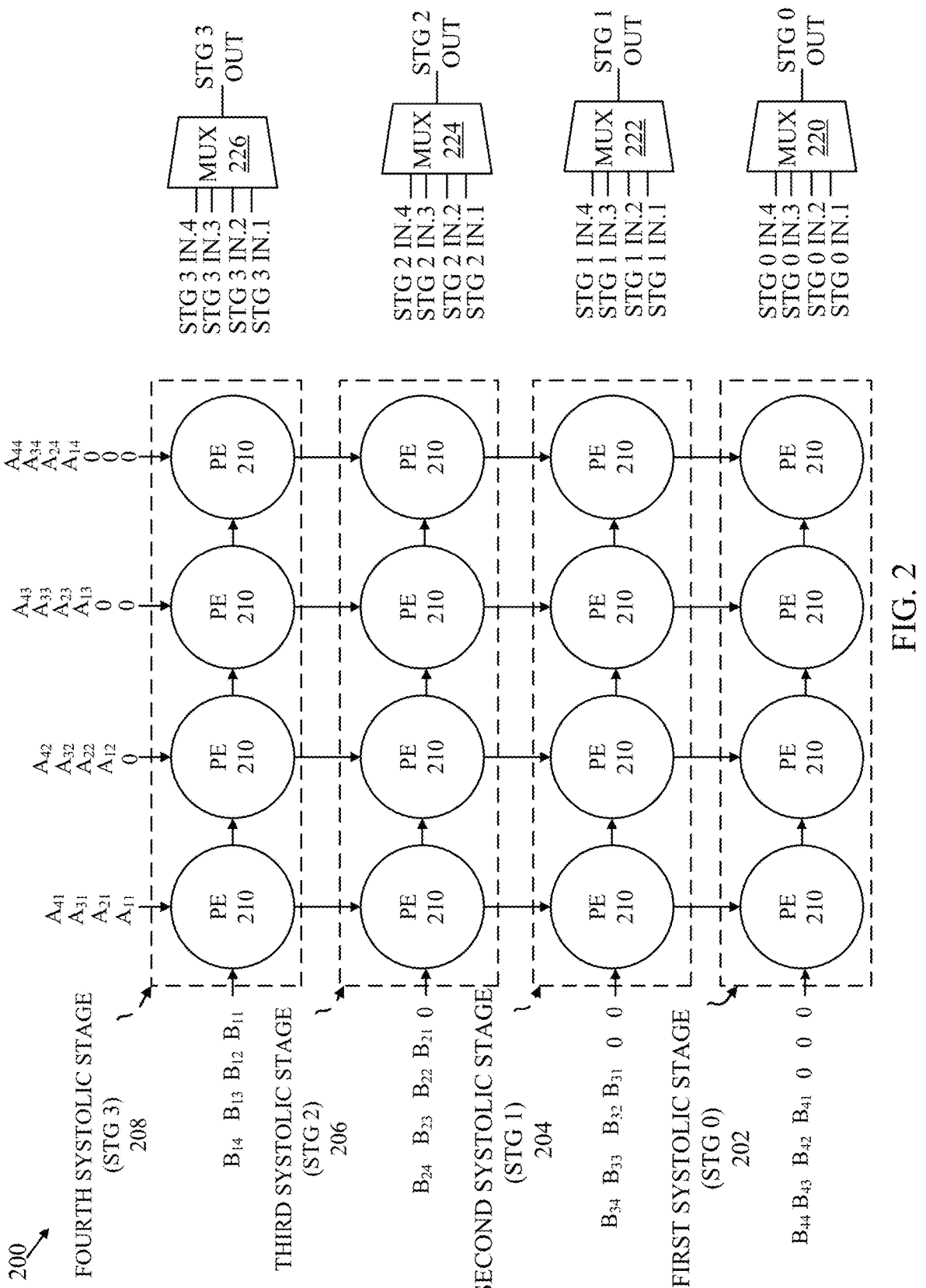
FIG. 2 depicts a systolic array according to various aspects of the present disclosure.

FIG. 2 depicts a systolic array 200 according to some embodiments of the present disclosure. The systolic array 200 includes a plurality of systolic stages. For instance, in some aspects, the systolic array 200 may include a first systolic stage 202, a second systolic stage 204, a third systolic stage 206, and a fourth systolic stage 208. In other aspects, the systolic array 200 may include more or fewer systolic stages.

Each of the plurality of systolic stages may include a plurality of processing elements 210. For instance, as illustrated in FIG. 2, the first systolic stage 202, the second systolic stage 204, the third systolic stage 206, and the fourth systolic stage 208 may include four processing elements 210. In other aspects, each of the plurality of systolic stages of the systolic array 200 may include more or fewer processing elements.

Each of the processing elements 210 may be configured to perform a computationally intensive task, such as matrix multiplication. Also, the systolic array 200 may have a grid structure (e.g., two-dimensional) that allows for the simultaneous execution of multiple matrix multiplication operations. For instance, as illustrated in FIG. 2, the grid structure may include multiple rows of processing elements 210 and multiple columns of processing elements 210. Furthermore, with a given row or column of the grid structure, each processing element 210 may be connected to its neighboring processing elements 210.

In some aspects, as illustrated in FIG. 2, two input matrices (e.g., Matrix A and Matrix B) may be fed into the systolic array 200. For example, matrix elements (e.g., denoted as A ##) of Matrix A may be loaded into the systolic array 200 column-by-column, with each column of Matrix A entering the systolic array 200 through a different column of processing elements 210. Additionally, matrix elements (e.g., denoted as $B_{\#\#}$) may be loaded into the systolic array 200 row-by-row, with each row of Matrix B entering the systolic array 200 through a different row of processing elements 210.

As the matrix elements flow through the systolic array 200, each respective processing element 210 may perform specific operations (e.g., multiply and accumulate) associated with matrix multiplication. More specifically, each respective processing element 210 may receive a matrix element from Matrix A and a matrix element from Matrix B. Each respective processing element 210 may multiply the two matrix elements and add (e.g., accumulate) a result of the multiplication to a partial sum stored in each processing element. This pipelined computation may continue as the matrix elements propagate through the systolic array 200 and a final result of the matrix multiplication may be obtained by collecting the output values from the systolic array 200. For instance, the accumulated result stored in each of the processing elements 210 may correspond to a different matrix element of a matrix (e.g., Matrix C) that is the result of multiplying Matrix A and Matrix B.

The transfer of matrix elements from one processing element 210 to its neighboring processing element 210 may be synchronized based on an input clock signal. For example, a matrix element in Matrix A may be passed (e.g., to the right) from one processing element 210 within a given row to another processing element 210 within the given row at the beginning of a clock cycle associated with the input clock signal. Additionally, a matrix element in Matrix B may be passed (e.g., down) from one processing element 210 within a given column to another processing element within the given column at the beginning of a clock cycle associated with the input clock signal.

As used herein, "clock cycle" may refer to a duration of time between two consecutive rising edges (or, alternatively, two consecutive falling edges) of the input clock signal. Thus, data may transfer from one processing element 210 to its neighboring processing element 210 when a current clock cycle of the input clock signal ends and a next clock cycle of the input clock cycle begins. In this manner, the rhythmic flow (e.g., similar to the systolic rhythm of a pumping action associated with a human heart) of the data through the systolic array 200 may be maintained.

In some aspects, the systolic array 200 may include a plurality of multiplexers. For example, the systolic array 200 may include a first multiplexer 220 associated with the first systolic stage 202 of the systolic array 200. The first multiplexer 220 may include a plurality of inputs (labeled as STG 0 IN. 1, STG 0 IN.2, STG 0 IN.3, STG 0 IN.4), with each of the plurality of inputs being coupled to a respective processing element 210 included in the first systolic stage 202 of the systolic array 200. In this manner, the first multiplexer 220 may receive the respective matrix element of Matrix C that each processing element 210 in the first systolic stage 202 calculated. Furthermore, the first multiplexer 220 may provide one of the plurality of inputs as an output (labeled STG 0 OUT).

In some aspects, the systolic array 200 may include a second multiplexer 222 associated with the second systolic stage 204 of the systolic array 200. The second multiplexer 222 may include a plurality of inputs (labeled STG 1 IN.1, STG 1 IN.2, STG 1 IN.3, STG 1 IN.4), with each of the plurality of inputs being coupled to a respective processing element 210 included in the second systolic stage 204 of the systolic array 200. In this manner, the second multiplexer 222 may receive the respective matrix element of Matrix C that each processing element in the second systolic stage 204 calculated. Furthermore, the second multiplexer 222 may provide one of the plurality of inputs as an output (labeled STG 1 OUT).

In some aspects, the systolic array 200 may include a third multiplexer 224 associated with the third systolic stage 206 of the systolic array 200. The third multiplexer 224 may include a plurality of inputs (labeled STG 2 IN.1, STG 2 IN.2, STG 2 IN.3, STG 2 IN.4), with each of the plurality of inputs being coupled to a respective processing element 210 included in the third systolic stage 206 of the systolic array 200. In this manner, the third multiplexer 224 may receive the respective matrix element of Matrix C that each processing element in the third systolic stage 206 calculated. Furthermore, the third multiplexer 224 may provide one of the plurality of inputs as an output (labeled STG 2 OUT).

In some aspects, the systolic array 200 may include a fourth multiplexer 226 associated with the fourth systolic stage 208 of the systolic array 200. The fourth multiplexer 226 may include a plurality of inputs (labeled STG 3 IN.1, STG 3 IN.2, STG 3 IN.3, STG 3 IN.4), with each of the plurality of inputs being coupled to a respective processing element 210 included in the fourth systolic stage 208 of the systolic array 200. In this manner, the fourth multiplexer 226 may receive the respective matrix element of Matrix C that each processing element in the fourth systolic stage 208 calculated. Furthermore, the fourth multiplexer 226 may provide one of the plurality of inputs as an output (labeled STG 3 OUT).

Clocking Systolic Stages of Systolic Array on Same-Edge of Clock Signal

Figure 3:
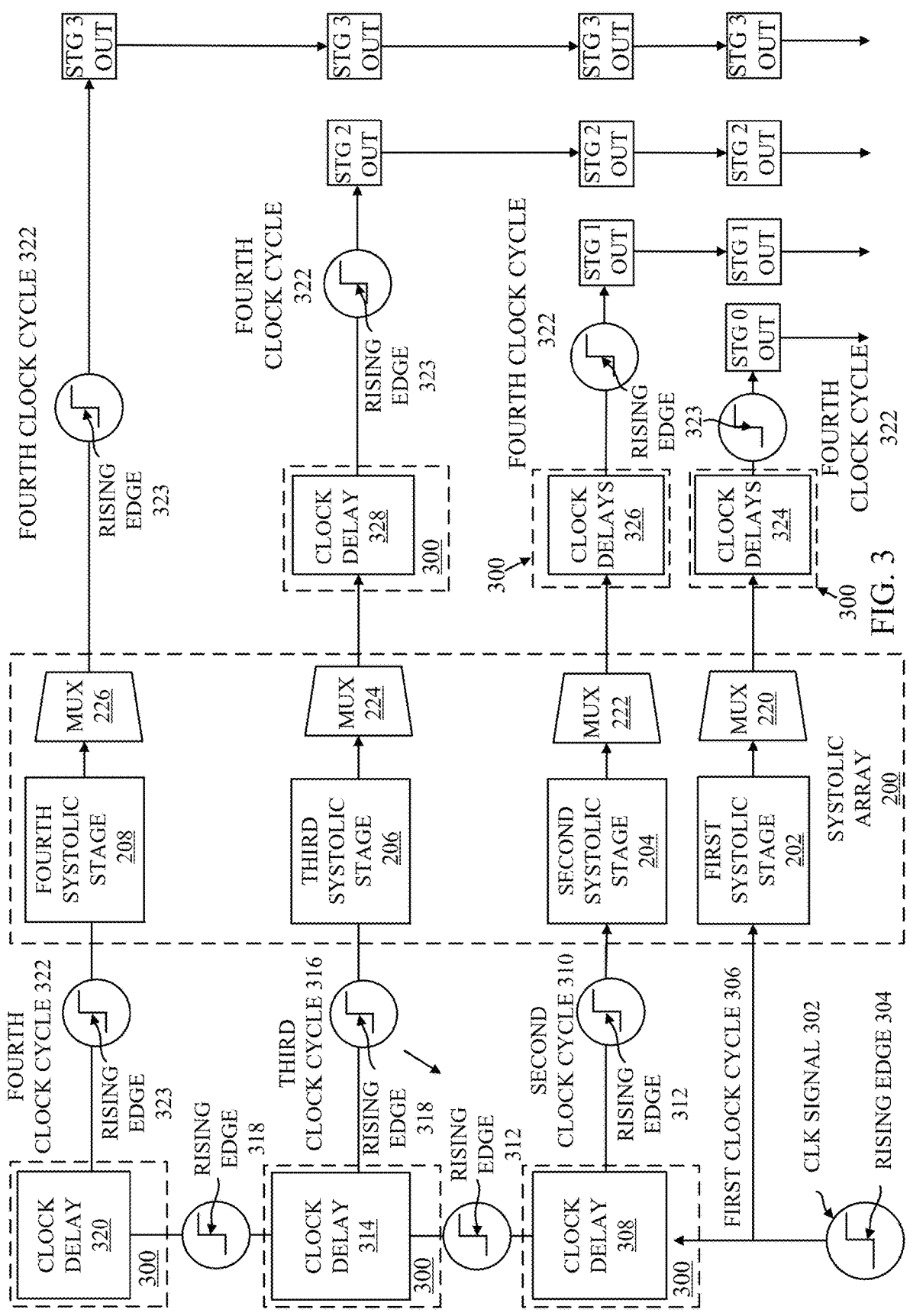
FIG. 3 depicts a block diagram of control logic for clocking systolic stages of a systolic array on the same edge of an input clock signal according to various aspects of the present disclosure.

FIG. 3 illustrates a block diagram of control logic 300 for clocking all of the systolic stages of the systolic array 200 on the same edge (e.g., rising edge) of a clock signal 302 according to some aspects of the present disclosure. As discussed above, operating the systolic array 200 in this manner is inefficient (e.g., in terms of power consumption) because clocking all of the systolic stages of the systolic array 200 on the same edge (e.g., rising edge) of the clock signal 302 causes a peak power demand of the systolic array 200 to occur at the same time (e.g., rising edge) for each clock cycle.

As illustrated, the first systolic stage 202 of the systolic array 200 is clocked on a rising edge 304 of the clock signal 302 denoting the beginning of a first clock cycle 306 of the clock signal 302. Furthermore, the control logic 300 includes a plurality of clock delays (e.g., delay registers) to facilitate the synchronized and pipelined data flow described above with reference to FIG. 2 that is associated with the systolic array 200. Details of the plurality of clock delays will now be discussed.

In some aspects, the control logic 300 includes a clock delay 308 (e.g., delay register) coupled between the first systolic stage 202 of the systolic array 200 and the second systolic stage 204 of the systolic array 200. More specifically, the clock delay 308 may be coupled between an input (e.g., first processing element) of the first systolic stage 202 and an input of the second systolic stage 204, such as an input of a first processing element (e.g., left-most processing element included in second systolic stage 204 of the systolic array 200 illustrated in FIG. 2). The clock delay 308 may be configured to delay the clock signal 302 by one clock cycle. In this manner, the clock delay 308 may delay clocking of the second systolic stage 204 of the systolic array 200 until the beginning of a second clock cycle 310 of the clock signal 302 that immediately follows the first clock cycle 306. Thus, the control logic 300 may clock the second systolic stage 204 of the systolic array 200 at a rising edge 312 of the clock signal 302 denoting the beginning of the second clock cycle 310.

In some aspects, the control logic 300 includes a clock delay 314 (e.g., delay register) coupled between clock delay 308 and the third systolic stage 206 of the systolic array 200. More specifically, the clock delay 314 may be coupled to an output of clock delay 308 and an input of the third systolic stage 206, such as an input of a first processing element (e.g., left-most processing element included in third systolic stage 206 of the systolic array 200 illustrated in FIG. 2). The clock delay may be configured to delay the clock signal 302 by one clock cycle. In this manner, the clock delay 314 may delay clocking of the third systolic stage 206 of the systolic array 200 until the beginning of a third clock cycle 316 of the clock signal 302 that immediately follows the second clock cycle 310. Thus, the control logic 300 may clock the third systolic stage 206 of the systolic array 200 at a rising edge 318 of the clock signal 302 denoting the beginning of the third clock cycle 316.

In some aspects, the control logic 300 includes a clock delay 320 (e.g., delay register) coupled between clock delay 314 and the fourth systolic stage 208 of the systolic array 200. More specifically, the clock delay 320 may be coupled to an output of clock delay 314 and an input of the fourth systolic stage 208, such as an input of a first processing element (e.g., left-most processing element included in fourth systolic stage 208 of the systolic array 200 illustrated in FIG. 2). The clock delay 320 may be configured to delay the clock signal 302 by one clock cycle. In this manner, the clock delay 320 may delay clocking of the fourth systolic stage 208 of the systolic array 200 until the beginning of a fourth clock cycle 322 of the clock signal 302 that immediately follows the third clock cycle 316. Thus, the control logic 300 may clock the fourth systolic stage 208 of the systolic array 200 at a rising edge 323 of the clock signal 302 denoting the beginning of the fourth clock cycle 322.

In some aspects, the control logic 300 includes a first set of clock delays 324 configured to synchronize an output (STG 0 OUT) of the first systolic stage 202 with an output (STG 3 OUT) of the fourth systolic stage 208. For example, the first set of clock delays 324 may include multiple clock delays that collectively delay delivery of the output of the first systolic stage 202 by a number of clock cycles (e.g., 5) such that the output of the first systolic stage 202 and the output of the fourth systolic stage 208 are delivered at the same time (e.g., on the rising edge 323 of the fourth clock cycle 322 of the clock signal 302).

In some aspects, the control logic 300 includes a second set of clock delays 324 configured to synchronize an output (STG 1 OUT) of the second systolic stage 204 with the output (STG 3 OUT) of the fourth systolic stage 208. For example, the second set of clock delays 326 may include multiple clock delays that collectively delay delivery of the output of the second systolic stage 204 by a number of clock cycles (e.g., 3) such that the output of the second systolic stage 204 and the output of the fourth systolic stage 208 are delivered at the same time (e.g., on the rising edge 323 of the fourth clock cycle 322 of the clock signal 302).

In some aspects, the control logic 300 includes a third set of clock delays 328 configured to synchronize an output (STG 2 OUT) of the third systolic stage 206 with the output (STG 3 OUT) of the fourth systolic stage 208. For example, the third set of clock delays 328 may include a single clock delay that delays the output of the third systolic stage 206 by a clock cycle that delays delivery of the output of the third systolic stage 206 by a clock cycle such that the output of the third systolic stage 206 and the output of the fourth systolic stage 208 are delivered at the same time (e.g., on the rising edge 323 of the fourth clock cycle 322 of the clock signal 302).

Figure 4:
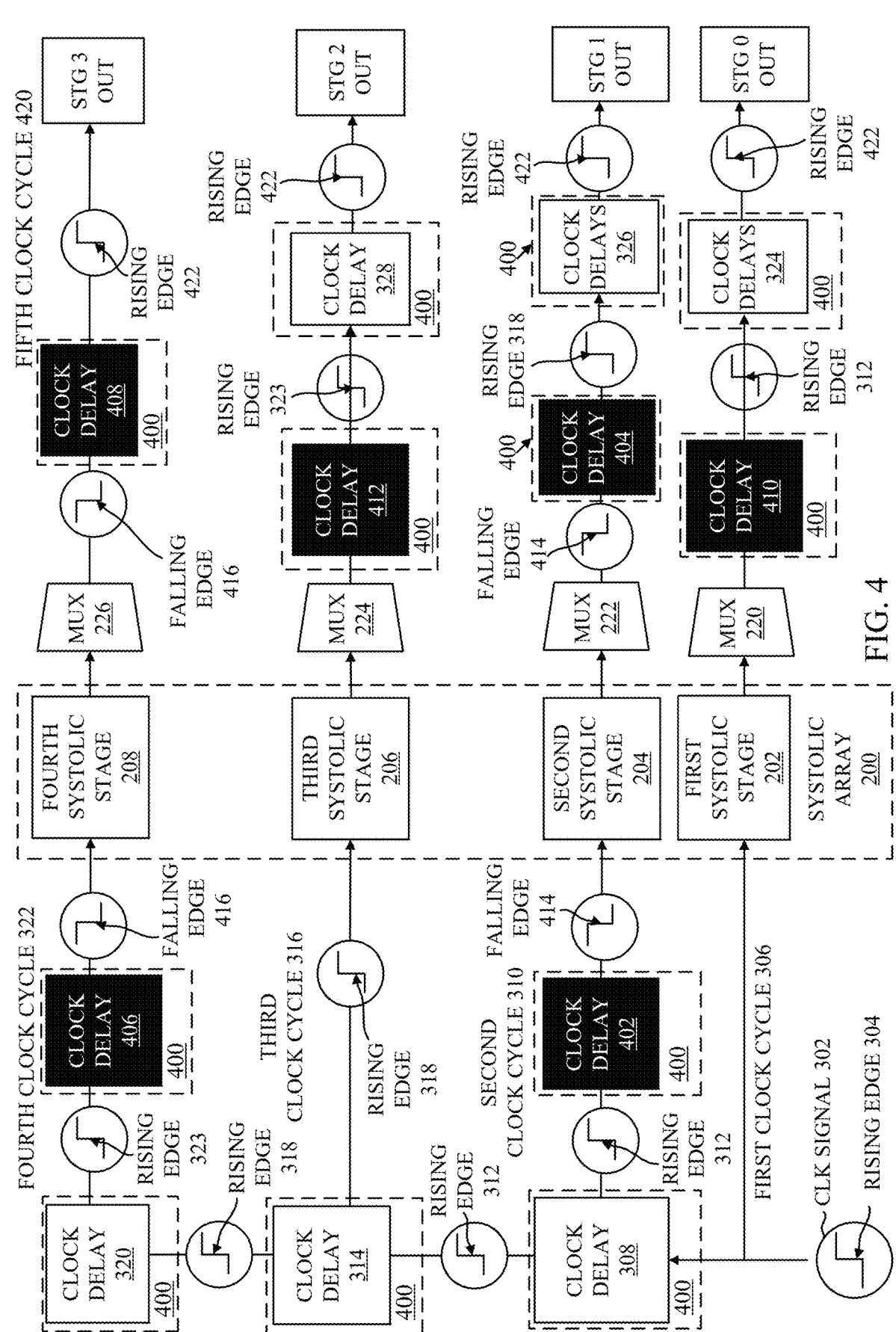
FIG. 4 depicts a block diagram of control logic for clocking systolic stages of a systolic array on alternating edges of an input clock signal according to various aspects of the present disclosure.

Clocking Systolic Stages of Systolic Array on Alternating Edges of Clock Signal FIG. 4 illustrates a block diagram of control logic 400 for clocking the systolic stages of the systolic array 200 on alternating edges of the clock signal 302 according to some aspects of the present disclosure. The control logic 400 depicted in FIG. 4 may include components of the control logic 300 discussed above with reference to FIG. 3. For example, the control logic 400 includes clock delay 308, clock delay 314, clock delay 320, first set of clock delays 324, second set of clock delays 326, and third set of clock delays 328.

The control logic 400 further includes two additional clock delays (e.g., clock delay 402 and clock delay 404) associated with the second systolic stage 204 of the systolic array 200, two additional clock delays (e.g., clock delay 406 and clock delay 408) associated with the fourth systolic stage 208 of the systolic array 200, and additional clock delays 410 and 412 associated with the first systolic stage 202 and the third systolic stage 206, respectively. The blocks in FIG. 4 denoting these additional clock delays, 402, 404, 406, 408, 410, 412 are solid (e.g., black) to highlight the difference between the control logic 400 of FIG. 4 and the control logic 300 of FIG. 3. Also, clocking the systolic stages of the systolic array 200 on alternating edges of the clock signal 302 as illustrated in FIG. 4 minimizes (or at least reduces) a peak current demand of the systolic array 200 for a given clock cycle as compared to a peak current demand of the systolic array 200 when all of the systolic stages of the systolic array 200 are clocked on the same edge (e.g., rising edge) of the clock signal as illustrated in FIG. 3.

In some aspects, clock delay 402 (e.g., delay register) is coupled between clock delay 308 and the second systolic stage 204 of the systolic array 200. For example, the clock delay 402 may be coupled between an output of clock delay 308 and an input of the second systolic stage 204, such as the left-most processing element included in the second systolic stage 204 of the systolic array 200 as illustrated in FIG. 2.

The clock delay 402 may provide an additional delay (e.g., at least half of a duration of the second clock cycle 310) to the clock signal 302 before clocking the second systolic stage 204. For example, the clock delay 402 may delay the clock signal 302 such that the second systolic stage 204 is clocked on a falling edge 414 of the clock signal 302. In this manner, the second systolic stage 204 of the systolic array 200 may be clocked on a different edge (e.g., the falling edge 414) of the clock signal 302 than the first systolic stage 202 (e.g., clocked on rising edge 304 of the clock signal 302) and the third systolic stage 206 (e.g., clocked on rising edge 318 of the clock signal 302).

In some aspects, clock delay 406 (e.g., delay register) is coupled between clock delay 320 and the fourth systolic stage 208 of the systolic array 200. For example, the clock delay 406 may be coupled between an output of clock delay 320 and an input of the fourth systolic stage 208, such as the left-most processing element included in the fourth systolic stage 208 of the systolic array 200 as illustrated in FIG. 2.

The clock delay 406 may provide an additional delay (e.g., at least half of a duration of the fourth clock cycle 322) to the clock signal 302 before clocking the fourth systolic stage 208. For example, the clock delay 406 may delay the clock signal 302 such that the fourth systolic stage 208 is clocked on a falling edge 416 of the clock signal 302. In this manner, the fourth systolic stage 208 of the systolic array 200 may be clocked on a different edge (e.g., the falling edge 416) of the clock signal 302 than the third systolic stage 206 (e.g., clocked on rising edge 318 of the clock signal).

Clock delay 408 may delay delivery of the output (STG 3 OUT) of the fourth systolic stage 208. For instance, clock delay 408 may delay delivery of the output of the fourth systolic stage 208 to a fifth clock cycle 420. More particularly, clock delay 408 may delay delivery of the output of the fourth systolic stage 208 to a beginning (e.g., rising edge 422) of the fifth clock cycle 420.

As illustrated, each of the first systolic stage 202, the second systolic stage 204, and the third systolic stage 206 may include an additional clock delay. For example, the first systolic stage 202 may include clock delay 410 in addition to the first set of clock delays 324. Clock delay 410 may delay delivery of the clock signal 302 to the first set of clock delays 324 until the beginning of the second clock cycle 310 of the clock signal 302. For example, the clock delay 410 may be triggered on the rising edge 304 of the clock signal 302 during the first clock cycle 306 and may deliver the clock signal 302 to the first set of clock delays 324 at the rising edge 312 of the clock signal 302 during the second clock cycle 310 of the clock signal 302.

The second systolic stage 204 may include clock delay 404 in addition to the second set of clock delays 326. Clock delay 404 may delay delivery of the clock signal 302 to the second set of clock delays 326 until the beginning of the third clock cycle 316 of the clock signal 302. For example, the clock delay 404 may be triggered on the falling edge 414 of the clock signal 302 during the second clock cycle 310 and may deliver the clock signal 302 to the second set of clock delays 324 at the rising edge 318 of the clock signal 302 during the third clock cycle 316 of the clock signal 302.

The third systolic stage 206 may include clock delay 412 in addition to the third set of clock delays 328. Clock delay 412 may delay delivery of the clock signal 302 to the third set of clock delays 328 until the beginning of the fourth clock cycle 322 of the clock signal 302. For example, the clock delay 412 may be triggered on the rising edge 318 of the clock signal 302 during the third clock cycle 316 and may deliver the clock signal 302 to the third set of clock delays 328 at the rising edge 323 of the clock signal 302 during the fourth clock cycle 322 of the clock signal 302.

To account for the additional delay (e.g., clock delay 406 and clock delay 408) associated with the fourth systolic stage 208, each of the first set of clock delays 324, the second set of clock delays 326, and the third set of clock delays 328 may include an additional delay compared to the number of delays included in each with reference to FIG. 3. For instance, in some aspects, the first set of clock delays 324 may include 6 separate clock delays (e.g., compared to 5 in the first set of clock delays 324 of FIG. 3), the second set of clock delays 326 may include 4 separate clock delays (e.g., compared to 3 in the second set of clock delays 326 of FIG. 3), and the third set of clock delays may include 2 clock delays (e.g., compared to 1 in the third set of clock delays 326 of FIG. 3). In this manner, the additional delay included in each of the first set of clock delays 324, second set of clock delays 326, and third set of clock delays 328 ensures the output (e.g., STG 0 OUT, STG 1 OUT, STG 2 OUT) of each of the first, second, and third systolic stages 202, 204, 206 of the systolic array 200 is synchronized (e.g., output at the same time) with the output (e.g., STG 3 OUT) of the fourth systolic stage 208.

In some aspects, clock delays 404, 410, 412 may each include a register and an initial clock delay included in each respective set of clock delays 326, 324, 328 may include a register as well. In alternative aspects, the initial clock delay included in each respective set of clock delays 326, 324, 328 may include a latch.

Example Method of Operating a Systolic Array

Figure 5:
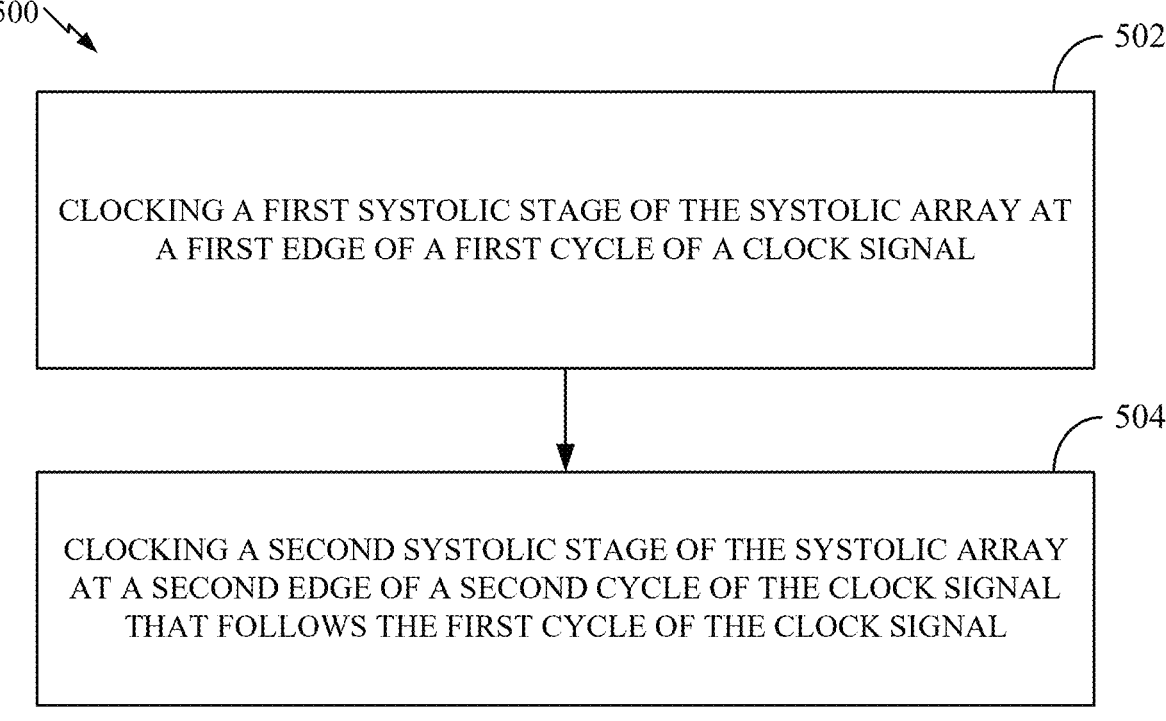
FIG. 5 depicts a method for clocking systolic stages of a systolic array on alternating edges of an input clock signal according to various aspects of the present disclosure.

FIG. 5 is a diagram depicting an example method 500 of operating a systolic array according to various aspects of the present disclosure. For example, the method 500 may be performed by the control logic 400 of FIG. 4. Furthermore, although FIG. 5 depicts steps performed in a particular order for purposes of illustration and discussion, the method 500 discussed herein is not intended to be limited to any particular order or arrangement. One skilled in the art, using the disclosure provided herein, will appreciate that various steps of the method 500 can be omitted, rearranged, combined and/or adapted in various ways without deviating from the scope of the present disclosure.

At 502, the method 500 includes clocking a first systolic stage (e.g., first systolic stage 202 illustrated in FIGS. 2 and 4) of the systolic array (e.g., systolic array 200 illustrated in FIGS. 2 and 4).

At 504, the method includes clocking a second systolic stage (e.g., second systolic stage 204 illustrated in FIGS. 2 and 4) of the plurality of systolic stages of the systolic array at a second edge of a second cycle of the clock signal that follows the first cycle of the clock signal. In certain aspects, clocking the second systolic stage of the systolic array at the second edge of the second cycle of the clock signal includes delaying the clock signal for a portion of the second clock cycle. Furthermore, in response to the delaying, clocking the second systolic stage of the systolic array at the second edge of the second cycle of the clock signal.

Example Processing System

Figure 6:
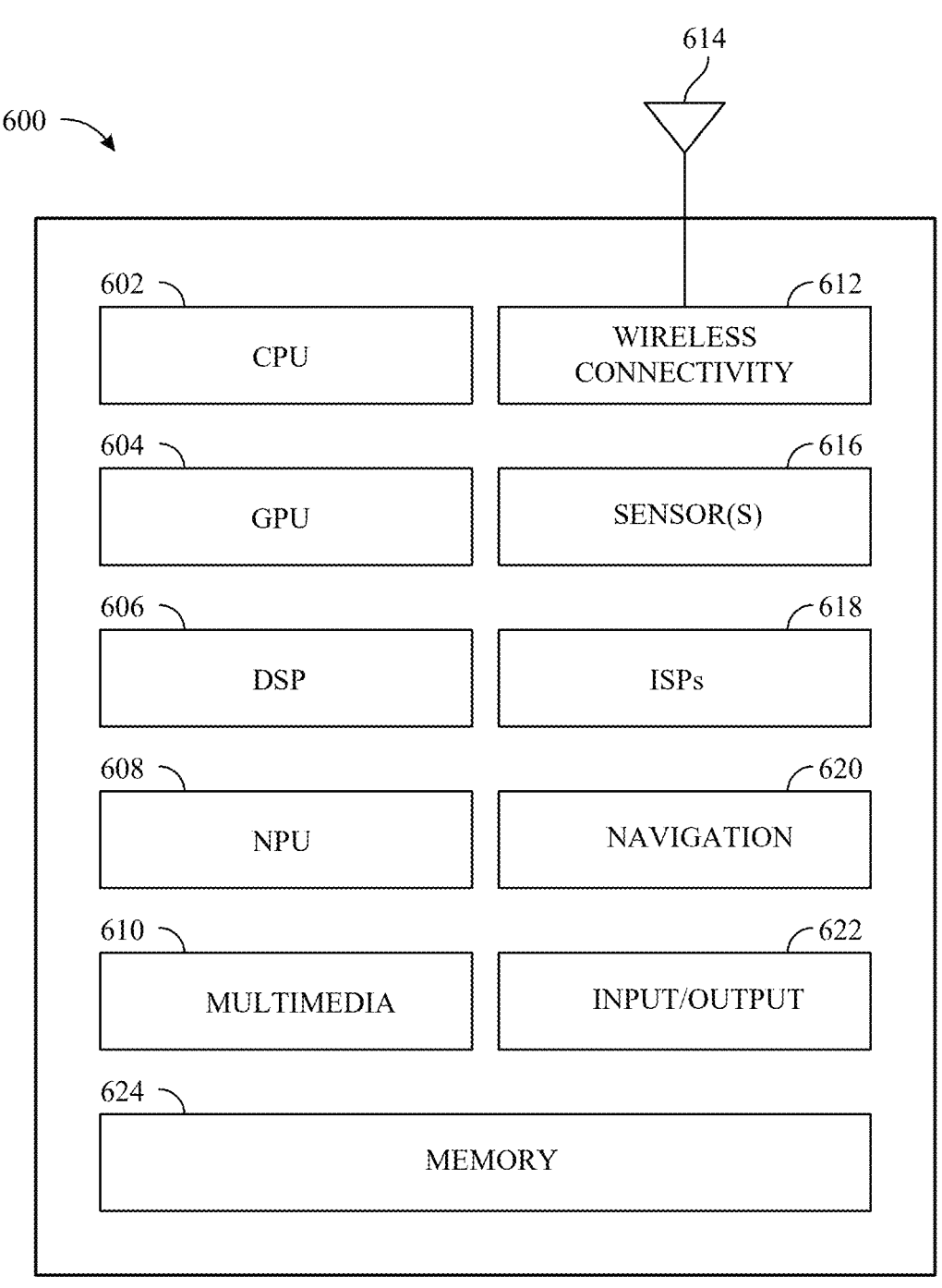
FIG. 6 depicts an example processing system in which a video processing system may be included according to various aspects of the present disclosure.

In some aspects, the heterogeneous computing system 100 discussed above with reference to FIG. 1 may be included in a device or processing system. FIG. 6 depicts an example processing system 600. Although depicted as a single system for conceptual clarity, in some aspects, as discussed above, the operations described below with respect to the processing system 600 may be distributed across any number of devices or systems.

The processing system 600 includes a central processing unit (CPU) 602. Instructions executed at the CPU 602 may be loaded, for example, from a memory 624 associated with the CPU 602.

The processing system 600 also includes additional processing components tailored to specific functions, such as a graphics processing unit (GPU) 604, a digital signal processor (DSP) 606, a neural processing unit (NPU) 608, a multimedia component 610 (e.g., a multimedia processing unit), and a wireless connectivity component 612.

An NPU, such as NPU 608, is generally a specialized circuit configured for implementing the control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing unit (TPU), neural network processor (NNP), intelligence processing unit (IPU), vision processing unit (VPU), or graph processing unit.

NPUs, such as the NPU 608, are configured to accelerate the performance of common machine learning tasks, such as image classification, machine translation, object detection, and various other predictive models. In some examples, a plurality of NPUs may be instantiated on a single chip, such as a SoC, while in other examples the NPUs may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process this piece of data through an already trained model to generate a model output (e.g., an inference).

In some implementations, the NPU 608 is a part of one or more of the CPU 602, the GPU 604, and/or the DSP 606.

In some examples, the wireless connectivity component 612 may include subcomponents, for example, for third generation (3G) connectivity, fourth generation (4G) connectivity (e.g., 4G Long-Term Evolution (LTE)), fifth generation connectivity (e.g., 5G or New Radio (NR)), Wi-Fi connectivity, Bluetooth connectivity, and/or other wireless data transmission standards. The wireless connectivity component 612 is further coupled to one or more antennas 614.

The processing system 600 may also include one or more sensor processing units 616 associated with any manner of sensor, one or more image signal processors (ISPs) 618 associated with any manner of image sensor, and/or a navigation processor 620, which may include satellite-based positioning system components (e.g., GPS or GLONASS), as well as inertial positioning system components.

The processing system 600 may also include one or more input and/or output devices 622, such as screens, touch-sensitive surfaces (including touch-sensitive displays), physical buttons, speakers, microphones, and the like.

In some examples, one or more of the processors of the processing system 600 may be based on an ARM or RISC-V instruction set.

The processing system 600 also includes the memory 624, which is representative of one or more static and/or dynamic memories, such as a dynamic random access memory, a flash-based static memory, and the like. In this example, the memory 624 includes computer-executable components, which may be executed by one or more of the aforementioned processors of the processing system 600.

Generally, the processing system 600 and/or components thereof may be configured to perform the methods described herein.

Notably, in other aspects, elements of the processing system 600 may be omitted, such as where the processing system 600 is a server computer or the like. For example, the multimedia component 610, the wireless connectivity component 612, the sensor processing units 616, the ISPs 618, and/or the navigation processor 620 may be omitted in other aspects. Further, aspects of the processing system 600 may be distributed between multiple devices.

Example Clauses

In addition to the various aspects described above, specific combinations of aspects are within the scope of the disclosure, some of which are detailed below:

Aspect 1: An apparatus, comprising: a systolic array comprising an initial systolic stage clocked at a first edge of a clock signal, the systolic array further comprising a plurality of additional systolic stages; and control logic configured to clock a first subset of the plurality of additional systolic stages at the first edge of the clock signal and a second subset of the plurality of additional systolic stages at a second edge of the clock signal, the second edge being different from the first edge.

Aspect 2: The apparatus of Aspect 1, wherein the initial systolic stage and each of the plurality of additional systolic stages comprise a plurality of processing elements, and wherein each respective processing element of the plurality of processing elements includes a multiplier and an accumulator.

Aspect 3: The apparatus of Aspect 1 or 2, wherein the control logic comprises: a first plurality of clock delay elements, each of the first plurality of clock delay elements configured to delay the clock signal an entire clock cycle, each of the first plurality of clock delay elements coupled to an input of a respective systolic stage of the plurality of additional systolic stages.

Aspect 4: The apparatus of Aspect 3, wherein the control logic further comprises: a first plurality of additional clock delay elements, each of the first plurality of additional clock cycle elements configured to delay the clock signal by a portion of the clock cycle, each of the first plurality of additional clock cycle elements coupled between a respective clock delay element of the first plurality of clock delay elements and the input of the respective systolic stage of the second subset of the plurality of additional systolic stages; and a second plurality of additional clock delay elements, each of the second plurality of additional clock cycle elements configured to delay the clock signal by a portion of the clock cycle, each of the second plurality of additional clock delay elements coupled to an output of the respective systolic stage of the second subset of the plurality of additional systolic stages.

Aspect 5: The apparatus of Aspect 4, wherein: each of the first plurality of additional clock delay elements is configured to trigger on the second edge of the clock signal; and each of the second plurality of additional clock delay elements is configured to trigger on the first edge of the clock signal.

Aspect 6: The apparatus of Aspect 4, wherein: each clock delay element included in the first plurality of clock delay elements comprises a first register triggered at the first edge of the clock signal; and each clock delay element included in the first plurality of additional clock delay elements comprises a second register triggered at the second edge of the clock signal.

Aspect 7: The apparatus of Aspect 4, wherein: each clock delay element included in the first plurality of clock delay elements comprises a register; and each clock delay element included in the first plurality of additional clock delay elements comprises a latch.

Aspect 8: The apparatus of Aspect 4, further comprising: a plurality of multiplexers, each of the plurality of multiplexers coupled between the output of the respective systolic stage of the plurality of additional systolic stages and a respective clock delay element included in the second plurality of additional clock delay elements.

Aspect 9: The apparatus of Aspect 4, further comprising: a second plurality of clock delay elements coupled to an output of the initial systolic stage; and a third plurality of clock delay elements coupled to a respective clock delay element included in the second plurality of additional clock delay elements.

Aspect 10: The apparatus of Aspect 9, wherein a total number of clock delay elements included in the third plurality of clock delay elements is greater than a total number of clock delays included in the third plurality of clock delay elements.

Aspect 11: The apparatus of any of Aspects 1 to 10, wherein the first edge comprises a rising edge of the clock signal and the second edge comprises a falling edge of the clock signal.

Aspect 12: A method of operating a systolic array, comprising: clocking a first systolic stage of the systolic array at a first edge of a first cycle of a clock signal; and clocking a second systolic stage of the systolic array at a second edge of a second cycle of the clock signal that follows the first cycle of the clock signal.

Aspect 13: The method of Aspect 12, wherein clocking the second systolic stage of the systolic array at the second edge of the second cycle of the clock signal comprises: delaying the clock signal by a half cycle; and in response to the delaying, clocking the second systolic stage of the systolic array at the second edge of the second cycle of the clock signal.

Aspect 14: The method of Aspect 13, further comprising: in response to clocking the second systolic stage of the systolic array, delaying the clock signal by the half cycle.

Aspect 15: The method of any of Aspect 12 to 14, wherein the first systolic stage and the second systolic stage each comprise a plurality of processing elements.

Aspect 16: The method of Aspect 15, wherein each respective processing element of the plurality of processing elements comprises a multiplier and an accumulator.

Aspect 17: The method of any of Aspects 12 to 16, wherein the first edge comprises a positive edge and the second edge comprises a falling edge.

Aspect 18: The method of any of Aspects 12 to 17, further comprising: clocking a third systolic stage of the systolic array at the first edge of a third cycle of the clock signal that follows the second cycle of the clock signal.

Aspect 19: An apparatus, comprising: means for clocking a first systolic stage of a systolic array at a first edge of a first cycle of a clock signal; and means for clocking a second systolic stage of the systolic array at a second edge of a second cycle of the clock signal.

Aspect 20: The apparatus of Aspect 19, wherein the first systolic stage and the second systolic stage each comprise a plurality of processing element, and wherein each of the plurality of processing elements comprises a multiplier and an accumulator.

Additional Considerations

The various operations of methods described above may be performed by any suitable means capable of performing the corresponding functions. The means may include various hardware and/or software components(s) module(s), including, but not limited to a circuit or processor. Generally, where there are operations illustrated in figures, those operations may have corresponding counterpart means-plus-function components with similar numbering.

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112 (f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus, comprising:
a systolic array comprising an initial systolic stage clocked at a first edge of a clock signal, the systolic array further comprising a plurality of additional systolic stages; and
control logic configured to clock a first subset of the plurality of additional systolic stages at the first edge of the clock signal and a second subset of the plurality of additional systolic stages at a second edge of the clock signal, the second edge being different from the first edge,
wherein the initial systolic stage and each of the plurality of additional systolic stages comprise a plurality of processing elements, wherein each respective processing element of the plurality of processing elements includes a multiplier and an accumulator, and
wherein the control logic comprises:
a first plurality of clock delay elements, each of the first plurality of clock delay elements configured to delay the clock signal an entire clock cycle, each of the first plurality of clock delay elements coupled to an input of a respective systolic stage of the plurality of additional systolic stages.

2. The apparatus of claim 1, wherein the control logic further comprises:
a first plurality of additional clock delay elements, each of the first plurality of additional clock cycle elements configured to delay the clock signal by a portion of the clock cycle, each of the first plurality of additional clock cycle elements coupled between a respective clock delay element of the first plurality of clock delay elements and the input of the respective systolic stage of the second subset of the plurality of additional systolic stages; and a second plurality of additional clock delay elements, each of the second plurality of additional clock cycle elements configured to delay the clock signal by a portion of the clock cycle, each of the second plurality of additional clock delay elements coupled to an output of the respective systolic stage of the second subset of the plurality of additional systolic stages.

3. The apparatus of claim 2, wherein:

each of the first plurality of additional clock delay elements is configured to trigger on the second edge of the clock signal; and each of the second plurality of additional clock delay elements is configured to trigger on the first edge of the clock signal.

4. The apparatus of claim 2, wherein:

each clock delay element included in the first plurality of clock delay elements comprises a first register triggered at the first edge of the clock signal; and each clock delay element included in the first plurality of additional clock delay elements comprises a second register triggered at the second edge of the clock signal.

5. The apparatus of claim 2, wherein:

each clock delay element included in the first plurality of clock delay elements comprises a register; and each clock delay element included in the first plurality of additional clock delay elements comprises a latch.

6. The apparatus of claim 2, further comprising:

a plurality of multiplexers, each of the plurality of multiplexers coupled between the output of the respective systolic stage of the plurality of additional systolic stages and a respective clock delay element included in the second plurality of additional clock delay elements.

7. The apparatus of claim 2, further comprising:

a second plurality of clock delay elements coupled to an output of the initial systolic stage; and a third plurality of clock delay elements coupled to a respective clock delay element included in the second plurality of additional clock delay elements.

8. The apparatus of claim 7, wherein a total number of clock delay elements included in the third plurality of clock delay elements is greater than a total number of clock delays included in the third plurality of clock delay elements.

9. The apparatus of claim 1, wherein the first edge comprises a rising edge of the clock signal and the second edge comprises a falling edge of the clock signal.

10. A method of operating a systolic array, comprising:

clocking a first systolic stage of the systolic array at a first edge of a first cycle of a clock signal; and clocking a second systolic stage of the systolic array at a second edge of a second cycle of the clock signal that follows the first cycle of the clock signal, wherein clocking the second systolic stage of the systolic array at the second edge of the second cycle of the clock signal comprises:

delaying the clock signal for a portion of the second cycle; and in response to the delaying, clocking the second systolic stage of the systolic array at the second edge of the second cycle of the clock signal.

11. The method of claim 10, further comprising:

in response to clocking the second systolic stage of the systolic array, delaying the clock signal for the portion of the clock cycle.

12. The method of claim 10, wherein the first systolic stage and the second systolic stage each comprise a plurality of processing elements.

13. The method of claim 12, wherein each respective processing element of the plurality of processing elements comprises a multiplier and an accumulator.

14. The method of claim 10, wherein the first edge comprises a rising edge and the second edge comprises a falling edge.

15. The method of claim 10, further comprising:

clocking a third systolic stage of the systolic array at the first edge of a third cycle of the clock signal that follows the second cycle of the clock signal.

16. An apparatus, comprising:

means for clocking a first systolic stage of a systolic array at a first edge of a first cycle of a clock signal; and means for clocking a second systolic stage of the systolic array at a second edge of a second cycle of the clock signal, wherein means for clocking the second systolic stage of the systolic array at the second edge of the second cycle of the clock signal comprises:

means for delaying the clock signal for a portion of the second cycle; and in response to the delaying, clocking the second systolic stage of the systolic array at the second edge of the second cycle of the clock signal.

17. The apparatus of claim 16, wherein the first systolic stage and the second systolic stage each comprise a plurality of processing elements, and wherein each of the plurality of processing elements comprises a multiplier and an accumulator.

* * * * *